United States Patent

Patrin

[11] 3,985,449
[45] Oct. 12, 1976

[54] SEMICONDUCTOR COLOR DETECTOR

[75] Inventor: Nicholas Alex Patrin, Shelburne, Vt.

[73] Assignee: International Business Machines Corporation, Armonk, N.Y.

[22] Filed: Feb. 7, 1975

[21] Appl. No.: 547,839

[52] U.S. Cl. .............................. 356/173; 357/24; 358/48
[51] Int. Cl.² ..................... G01J 3/46; H01L 29/78; H04N 9/06
[58] Field of Search .................. 357/24, 30, 31, 32; 358/48; 307/304; 356/173

[56] References Cited
UNITED STATES PATENTS

| | | | |
|---|---|---|---|
| 3,771,149 | 11/1973 | Collins et al. | 357/32 |
| 3,858,232 | 12/1974 | Boyle et al. | 307/304 X |
| 3,860,956 | 1/1975 | Kubo et al. | 358/48 |

Primary Examiner—John K. Corbin
Assistant Examiner—Rolf Hille
Attorney, Agent, or Firm—Francis J. Thornton

[57] ABSTRACT

A system for detecting and analyzing the color of light impinging on a solid state imaging device or scanner. The scanner is composed of a triplet array of semiconductor photoelements with each photoelement in the array biased to act as a unique detector of a selected set of primary colors. Each photoelement is coupled to an photocurrent analyzing system which comprises a detection amplifier coupled to a trio of scaling amplifiers each of which in turn is coupled to a respective one of a trio of adder circuits. The output of each of these adder circuits is a signal indicative of the magnitude of a respective primary color impinging on the triplet array of photoelements.

Large area color scanning systems can be realized by using a plurality of such triplet photoelements and coupling these to a series of shift registers for sensing the current created in the photoelements by the different colors of light impinging on the photoelements and analyzing the current or charge outputs of the photoelements to determine the colors of the light falling on the photoelements.

9 Claims, 5 Drawing Figures

SEMICONDUCTOR COLOR DETECTOR

BACKGROUND OF THE INVENTION

1. Field of the Invention

This invention relates generally to solid state scanning devices and more particularly to a system of detecting and analyzing the color of light falling on a solid state imaging device or scanner.

2. Description of the Prior Art

Solid state imaging arrays are well known to the art. U.S. Pat. No. 3,721,839 describes a typical solid state imaging array. The array, described in this patent, employes junction FET's as the photoelements. Each of these JFET's is biased so that under illumination it is conductive. The use of such JFET's achieve a higher signal to noise ratio than prior art vidicons.

The present invention, however, describes an improved solid state imaging array for operation in the charge storage mode which provides not only the high signal to noise ratios achievable by the prior art but also has a density structure, increased speed of response, and significantly increased resolution not achievable by the prior art.

A further object of the invention is to provide a high density semiconductor imaging array easily fabricated with present techniques.

Still another object of the invention is to described a complete integral solid state system for detecting and analyzing the color of light impinging on the imaging array of the invention.

Still another object of the invention is to describe a large area scanning system by utilizing an array of photoelements coupled to a series of shift registers sensing the current created in the photoelements by the different colors of light impinging on the photoelements and again analyzing the current output of the photoelements to determine the colors of the lights falling on the photoelements.

These and other objects of the present invention are achieved by employing a complete solid state scanning system integrated in a single crystal wafer of one type conductivity semiconductor material. The wafer is provided with a relatively thin layer of the opposite type conductivity diffused or ion-implanted therein and a plurality of insulated electrodes on its surface that, when biased, will provide a depleted region between the surface and the junction between the two conductivity regions. When light enters the body of the wafer it is absorbed by the semiconductor material of the substrate at the depth of penetration of the light and a photocurrent is generated. Because the depth of penetration of the light is a function of the color of the light impinging on the element, analysis of the depth of the generated photocurrent can determine the color of the light impinging on the array.

These and other features, objects, and advantages of the present invention would be more fully realized from the following description of the drawings in which:

FIG. 1 is a sectional view of a single photoelement of the array and a sensing node for that element.

FIG. 2 schematically illustrates an overall system for analyzation of light from a triplet array of photoelements in accordance with the present invention.

Figure 5:
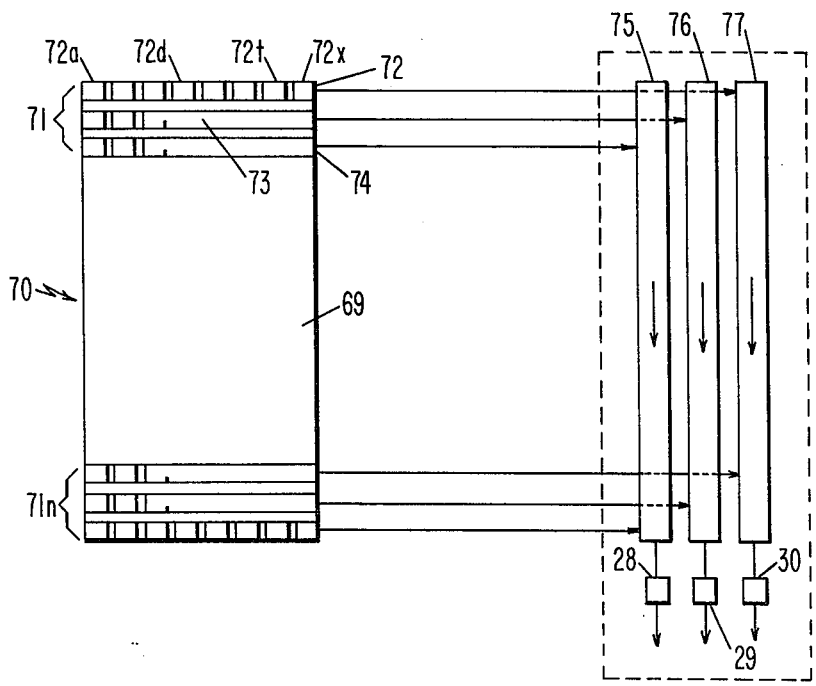

FIG. 5 schematically illustrates a large scale area array employing shift registers and continuous sensing of the light impinging on the photoelement array.

Figure 1:
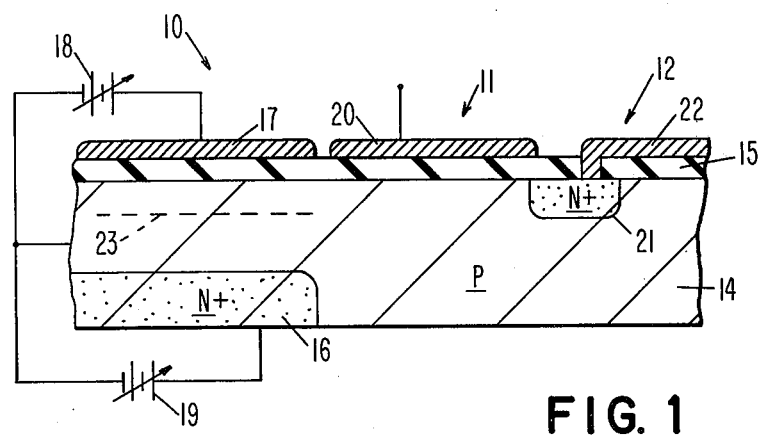

Referring now to FIG. 1 there is depicted a photoelement 10 useful in the present invention together with a transfer gate 11 and a charge sensing node 12 all integrated in a body 14 of suitable semiconductor material. Such as photoelement 10 is formed in the body 14 which may be for example P type semiconductor material coated with an insulating oxide layer 15. The photoelement comprises an N type region 16 and a transparent or partially transparent electrode 17 disposed on the surface of the oxide 15 over the region 16. The region 16 and the electrode 17 are such that when they are biased positive with respect to the body 14 by suitable power supplies 18 and 19 a depletion region will be formed in the body 14 extendng between the electrode 17 and the diffusion 16.

The transfer gate 11 also comprises an electrode 20 disposed on the oxide 15. The electrode 20 is adjacent to or overlaps the electrode 17 and extends so as to be immediately adjacent an N type sensing diffusion 21 created in the body 14 just below the surface of the oxide 15. An electrode 22 is connected to the sensing diffusion 21.

By varying the voltage levels applied to the body 14, the region 16, and the electrode 17, the PN junction deplection region around the diffusion 16 and the depletion region created beneath the electrode 17 can be made to extend across the entire width of body 14 between the electrode 17 and the junction 16. Thus the entire region of the body between the electrode 17 and the diffusion 16 is depleted. The position of the plane denoting the location of the maximum electrode potential energy in the depletion region, represented by the dotted line 23, between the electrode 17 and the region 16 can be shifted closer to the electrode 17 or closer to the diffusion 16 by varying the voltages or ratio of the voltages applied to the body 14, the region 16 and the electrode 17 by supplies 18 and 19. If one assumes that light enters the body 14 through the electrode 17, the light will be absorbed causing hole-electron pair generation as it travels through the body 14. The absoprtion rate and the depth of penetration of the light is a strong function of the color or wave length of the light entering the substrate. For example, the penetration of violet light is very shallow while the penetration of red light is very deep. Thus with the plane 23 at a given distance from the surface known fractions of the spectral components of the light are absorbed between the plane 23 and the surface. With a given photoelement, as shown in FIG. 1, electrons created by the light above the plane 23 will be swept to the surface and stored there while electrons generated below the plane 23 will be swept to and leave via the region 16.

Since conventional color detection and reproduction systems such as color television key on the determination of the magnitudes of the three primary components red, green, and blue, the description that follows will also key on these three components. The system described herein can, of course, be simplified or expaned to provide lower or higher fidelity color detection as required.

If we choose the three components such as blue, green, and red then for a given distance $x$ extending from the surface of the body 14 to the plane 23 as determined by a first ratio of the applied voltages the fractions of these three components absorbed within the distance $x$ are $a_1$, $b_1$, and $c_1$.

These absorbed light magnitudes will generate hole electron charge pairs in the semiconductor within the distance $x=x_1$ of the surface, i.e. the plane 23 is established at a distance $x_1$ from the surface of the body. Due to the established electric fields in this region, the generated electrons will flow to the surface while the generated holes will flow toward the undepleted semiconductor bulk and effectively flow out of the semiconductor thru the substrate contact. The flow of electrons to the surface can be described by a current $I_1$, $$I_1 = a_1 I_B + b_1 I_G + c_1 I_R$$

where $I_B$, $I_G$, $I_R$ are the total electron currents generated by the incident blue, green, and red light radiation components respectively, and $a_1$, $b_1$, $c_1$ are the fractions of these components that flow to the silicon surface. After this current $I_1$ is sensed either directly or by sensing the total charge $Q_1$ collected at the surface during a short time interval $t_1$ by removing the charge to the sensing diffusion $Z_1$, the voltage bias conditions are changed to shift the location of plane 23 in the body 14 to $x=x_2$ such that a new current with different values of $a$, $b$, $c$ is obtained.

$$I_2 = a_2 I_B + b_2 I_G + c_2 I_R$$

This new current $I_2$, or the collected charge $Q_2$ are again sensed and the voltages readjusted again so that the location of the plane 23 is shifted to $x=x_3$ and a third current $I_3$ is obtained.

$$I_3 = a_3 I_B + b_3 I_G + c_3 I_R$$

These three current equations, or associated total charge equations, can now be solved for the unknown color components $I_B$, $I_G$, $I_R$ to obtain $$I_B = B_1 I_1 + B_2 I_2 + B_3 I_3$$

$$I_G = G_1 I_1 + G_2 I_2 + G_3 I_3$$

$$I_R = R_1 I_1 + R_2 I_2 + R_3 I_3$$

where the constants $B_1, B_2, \ldots, R_2, R_3$ are known from devices physical and electrical properties and bias conditions. For example, $$B_1 = (b_2 c_3 - b_3 c_2)/\Delta$$

$$B_2 = (b_3 c_1 - b_1 c_3)/\Delta$$

$$B_3 = (b_1 c_2 - b_2 c_1)\Delta$$

$$\Delta = (a_1 b_2 c_3 + a_2 b_3 c_1 + a_3 b_1 c_2) - a_1 b_3 c_2 + a_2 b_1 c_3 + a_3 b_2 c_1)$$

As a further example, the fractions $a_1, b_1, \ldots b_3, c_3$ can be determined for a given device design as follows. For a given set of bias conditions such that the plane 23 (maximum electron potential location position) is at $x=x_1$, the fraction $a_1$ of blue light ($\lambda = 4700A$) absorbed within $x_1$ of the surface is simply $$a_1 = 1 - e^{-\alpha_B \cdot x_1}$$

where $\alpha_B$ is the absorption coefficient for blue light $$\alpha_B = 1.3 \times 10^4 \text{ (cm}^{-1}\text{)} \quad \lambda = 4700A$$

similarly $$b_1 = 1 - e^{-\alpha_G \cdot x_1} \cdot \alpha_G = 8.4 \times 10^3 \text{ (cm}^{-1}\text{)}, (\lambda = 5200A)$$

$$c_1 = 1 - e^{-\alpha_R \cdot x_1} \cdot \alpha_R = 3 \times 10^3 \text{ (cm}^{-1}\text{)}, (\lambda = 6500A)$$

The fractions $a_2$, $b_2$, $c_2$ can be obtained from these equations by replacing $x_1$ by $x_2$, the fractions $a_3$, $b_3$, $c_3$ can similarly be obtained by using the $x=x_3$ value appropriate for the third set of bias conditions used.

Figure 2:
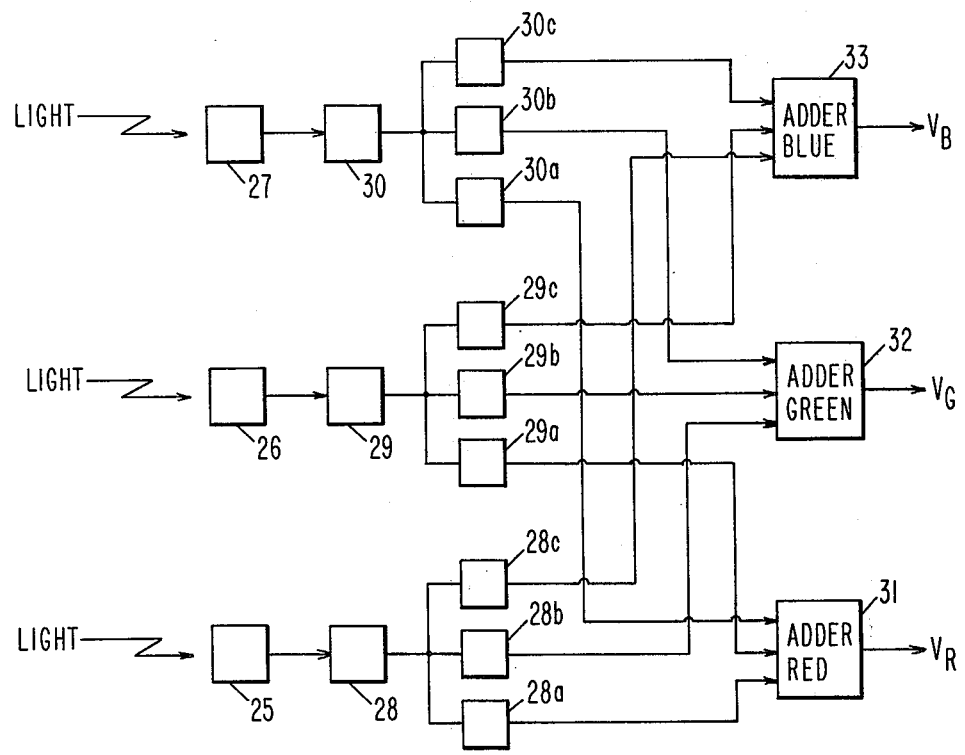

An exemplary system for the detection of color is shown in FIg. 2. This FIG. illustrates three photoelements 25, 26, and 27 each coupled to a respective detection amplifier 28, 29, and 30. Each of these detection amplifiers is in turn coupled to a trio of scaling amplifiers. Thus a detector 28 is coupled to scaling amplifiers 28a, 28b, and 28c while detection amplifier 29 is coupled to scaling amplifiers 29a, 29b, and 29c and detection amplifier 30 is coupled to scaling amplifiers 30a, 30b, and 30c. The outputs of each of these scaling amplifiers is in turn coupled to a respective adder circuit 31, 32, and 33. Thus each of the scaling amplifiers 28a, 29a, and 30a are coupled to adder circuit 31, while the outputs of scaling amplifiers 28b, 29b, and 30b are coupled to adder circuit 32 and the outputs of scaling amplifiers 28c, 29c, and 30c are all coupled to adder circuit 33. The output of each of these adder circuits is an indicator of a respective color. Thus the output of adder circuit 31 is a voltage indicative of the incident flux of red light falling on the trio of photoelements 25, 26, and 27, the output of adder circuit 32 being the voltage indicative of the green component of the light and the output of 33 being indicative of the blue component of light.

Briefly the system depicted in FIG. 2 operates as follows. Let us assume that the photoelements 25, 26, and 27 are each individually biased to have the plane 23 occur at unique locations $x_1, x_2, x_3$ in these photoelements and are all exposed to the same incident light. The light flux passing into the silicon will be described by $$\phi = ar \, \phi r + ag \, \phi g + ab \, \phi b$$

where $\phi r$, $\phi g$, $\phi b$ are unity color vectors (red, green, blue) and $ar$, $ag$, $ab$ are the relative flux densities of these three components. For a given set of bias conditions on the photoelements 25, 26, and 27 let the respective charge collected by each photoelement during a period $t$ be denoted by $Q_1$, $Q_2$, and $Q_3$. Thus there is obtained three charge packets whose magnitudes can be related to the light flux components via $$Q_1 = d_{11} \, ar + d_{12} \, ag + d_{13} ab$$

$$Q_2 = d_{21} \, ar + d_{22} \, ar + d_{23} \, ab$$

$$Q_3 = d_{31} \, ar + d_{32} \, ar + d_{33} \, ab \quad (1)$$

where the d factors in each equation represent constants that are predetermined from the known device structural and electrical properties as well as from the bias conditions. Let these three charge packets be transferred in parallel to the detection amplifier 28, 29, and 30 where they, as will be later explained, be converted into signal voltages $V_1$, $V_2$, and $V_3$ that are respectively proportional to the charge packets $Q_1$, $Q_2$, and $Q_3$.

By defining $$d_{11}\, ar/C_n = B_{11}\, V_R \qquad d_{21}\, ar/C_n = B_{21}\, V_R \qquad d_{31}\, ar/C_n = B_{31}\, V_R$$
$$d_{21}\, ag/C_n = B_{12}\, V_G \qquad d_{22}\, ag/C_n = B_{22}\, V_G \qquad d_{32}\, ag/C_n = B_{32}\, V_G$$
$$d_{13}\, ab/C_n = B_{13}\, V_B \qquad d_{23}\, ab/C_n = B_{23}\, V_B \qquad d_{33}\, ab/C_n = B_{33}\, V_B$$

where $C_n$ = capacitance of the sensing mode in each detection amplifier then the equation set (1) can be written as $$V_1 = B_{11}\, V_R + B_{12}\, V_G + B_{13}\, V_B$$

$$V_2 = B_{21}\, V_R + B_{22}\, V_G + B_{23}\, V_B$$

$$V_3 = B_{31}\, V_R + B_{32}\, V_G + B_{33}\, V_B \qquad (2)$$

where $V_R$, $V_G$, $V_B$ are signal voltages that are proportional to the color flux density components $ar$, $ag$, $ab$. The color voltage signal level equations can be solved for by simply inverting equation set (2)

$$V_R = A_{11}\, V_1 + A_{12}\, V_2 + A_{13}\, V_3$$

$$V_G = A_{21}\, V_1 + A_{22}\, V_2 + A_{23}\, V_3$$

$$V_B = A_{31}\, V_1 + A_{32}\, V_2 + A_{33}\, V_3$$

where the A factors in each equation represent constants related to the known physical and electrical perameters and bias conditions of the scaling amplifiers.

Thus to extract the color information from the integrated charge levels $Q_1$, $Q_2$, $Q_3$, and the associated voltages $V_1$, $V_2$, $V_3$, requires only the processing depicted by the schematic shown in FIG. 2. In this FIG. the signal outputs from the detecting amplifiers 28, 29, and 30 are shown to be fed to respective scaling amplifiers 28a, 28b, 28c, 29a, 29b, 29c, 30a, 30b, and 30c and on to adding stages 30, 32, and 33. The outputs of these adding stages are then the color signals $V_R$, $V_G$, $V_B$. The system depicted in FIG. 2 can be adapted to use only a single photoelement and two non-photosensitive storage elements $S_1$, $S_2$. The advantage of the three photoelement system over a system employing but a single photoelement lies in the ability to integrate all three signal charge levels in one distinctive period where the single photoelement arrangement requires three distinct time periods. Thus in the three photoelement system integration of the next 'frame' can begin immediately after the charges $Q_1$, $Q_2$, and $Q_3$ are passed to the detection amplifiers.

Figure 3:
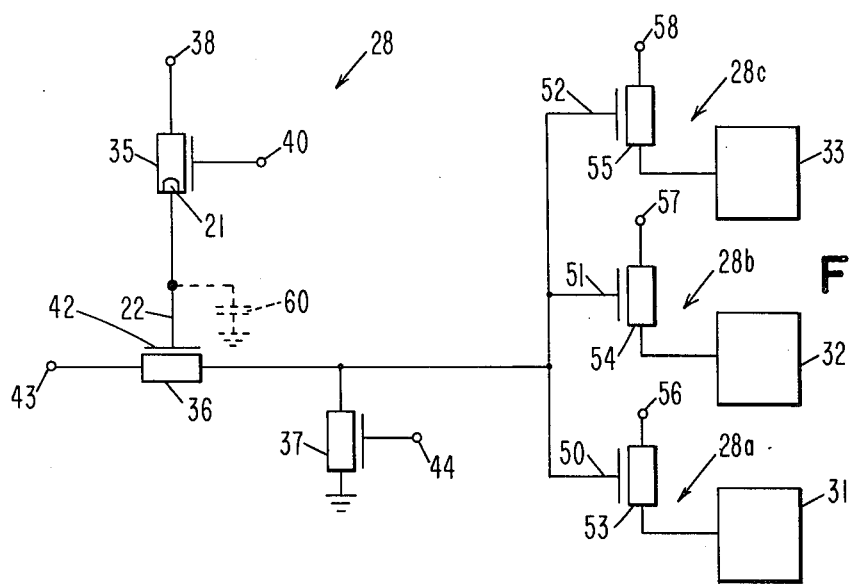
FIG. 3 depicts schematically a sensing node, detection amplifier, and scaling amplifiers suitable for use in the analyzing system depicted in FIG. 2.

A circuit that can be used to perform the required detection and scaling function is depicted in FIG. 3. For simplicity in explanation only a single detection amplifier 28 is described together with its associated scaling amplifiers 28a, 28b, and 28c. Detection amplifier 28 comprises three field effect transistors 35, 36, and 37. Transistor 35 has its drain connected to a first voltage supply 38 and its gate connected to a second voltage supply 40 and its source, which is the diffusion 21 in FIG. 1, connected to the gate 42 of FET 36 via lead 22. The drain of FET 36 is in turn connected to a third voltage supply 43 and its source connected to the drain of FET 37 and to the gates 50, 51, and 52 of FET's 53, 54, and 55 that serve respective as the scaling amplifiers 28a, 28b, and 28c. The gate of FET 37 is connected to a fourth voltage supply 44 and its source is grounded.

The drain of each scaling amplifier transistor 53, 54, and 55 is connected to an individual respective power supply 56, 57, and 58. While the source of each scaling amplifier transistor 53, 54, and 55 is connected to a different adder circuit 31, 32, and 33 as shown in FIG. 2. Although the power supplies 28, 40, 44, etc. have been uniquely labeled, in an actual design these supplies need not necessarily be all unique.

This detection amplifier 28 operates as follows. Initially a suitable voltage pulse from supply 40 is applied to the gate of FET 35 causing the FET 35 to become conductive and thereby apply a voltage from supply 38 to the gate 22 of FET 36. This voltage from supply 38 will cause capacitance of the line 22, the gate 42, and the diffusion 21 to become charged to the level of supply 38. This total capacitance is represented by capacitor 60. Once this capacitor 60 is charged to the level of supply 38, supply 40 may be shut off rendering device 35 nonconductive. This voltage, on the capacitance 60, is sufficient to cause device 36 to be conductive permitting a current to flow through device 36 and to charge the gates 50, 51, and 52 of each of the scaling amplifier transistors 53, 54, and 55 to a specified level. The transistor 37 is used as a resistor to ground and its resistance level is adjusted by an appropriate voltage on its gate from source 44 to set the voltage levels of gate 50, 51, and 52.

If the voltages applied to the gates of transistors 36 and 37 are sufficient to operate the transistors 36 and 37 in their linear range, then when a signal is applied to the sensing node or diffusion 21 the capacitance 60 is at least partially discharged changing the voltage on the gate of the transistor 36. This change in gate voltage causes the conductance of device 36 to change which in turn causes the voltate applied to gates 50, 51, 52 to change. Thus the voltage applied to the gates 50, 51, and 52 has a component which is proportional to the color flux density impinging upon the photoelement 25. If the device 53 is also operated in the linear range, the signal applied by device 53 to the adder circuit 31 contains component $A_{11}\, V_1$. At the same time, the devices 54 and 55 can be designed to transmit to adder 32 and to adder 33 respectively the signals that have the components $A_{21}V_1$, $A_{31}V_1$ respectively. Providing similar circuitry for the other detection amplifiers and scaling amplifiers shown in FIG. 2 leads to the following signals being supplied to the adder circuits 31, 32, and 33 respectively.

$$I_{011} - A_{11}V_1 + I_{012} - A_{12}V_2 + I_{013} - A_{13}V_3 \text{ to adder 31}$$

$$I_{021} - A_{21}V_1 + I_{022} - A_{22}V_2 + I_{023} - A_{23}V_3 \text{ to adder 32}$$

$$I_{031} - A_{31}V_1 + I_{032} - A_{32}V_2 + I_{033} - A_{33}\text{i}V_3 \text{ to adder 33}$$

Figure 4:
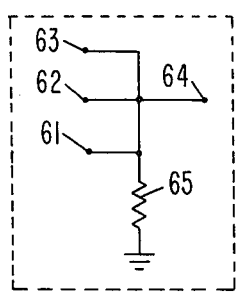
FIG. 4 depicts an adder circuit suitable for use with the circuits of FIG. 3.

Turning now to FIG. 4 there will be described a simple circuit for performing the adder function. This circuit comprises a simple load resistor 65 coupled between inputs 61, 62, and 63 and ground. The inputs 61, 62, and 63 would each be connected to a different scaling amplifier set. For example, input 61 could be from scaling amplifier 28a, input 62 from scaling amplifier 29a and input 63 from scaling amplifier 30a. Thus at the voltage of the output node 64 of the adder circuit is a summation of each of the input voltages. For this given example the output of adder 31 is a voltage representative of the red light impinging on the trio of photoelements 25, 26, 27, the output of adder 32 a voltage representative of the green light and the output of adder 33 representative of the blue light. Shown in FIG. 5 is an area array scanner built in accordance with the present invention. Shown is an Nx3M photoelement array 70 built on a body 69 containing an underlying diffused or ion-implanted region not shown. The array 70 is comprised of a multiplicity of sets of triplet shift registers having transparent electrodes of which only two sets, the first 71 and the last 71n, are shown. Each shift register in each set is coupled to a respective shift register 75, 76, or 77.

Each shift register, making up such a triplet set may be, for example, a charge coupled shift register, either two phase or three phase, as described, for example, in U.S. Pat. No. 3,819,959 issued June 25, 1974 to J. J. Chang, et al. and assigned to the same assignee as the present invention.

Thus triplet set 71 is comprised, for example, of three, three phase charge coupled shift registers 72, 73, and 74. In building such an array, different insulator thicknesses could be used under each shift register of the triplet set to establish the three different levels of electron potential energy minimum per triplet that is required to determine the three different colors. By so using three different oxide thicknesses standard charge coupled operating pulses can be used to shift the received information out of each register.

Thus, for example, the oxide thickness under register 72 would be less than that under register 73 which in turn would be less than that under register 74. As shown, each register is comprised of a multiplicity of electrodes. When operated as a photoelement only the first phase electrodes, of each shift register, in each triplet set, would be biased to serve as photoelements in accordance with the invention. This for example, in register 72, electrodes 72a and 72d would be biased to serve as photoelements while the penultimate electrode 72T would be a transfer gate and the ultimate electrode 72x would be over a suitable sensing diffusion and be coupled to another shift register 77.

Thus, upon exposure to light, register 74, for example, would be primarily sensitive to that spectrum of light below the blue reference level, register 73 would be primarily sensitive to the spectrum below the green reference level and register 72 would be primarily sensitive to the entire spectrum below the red reference level.

Following exposure of such an array to light, the information would be initially stored under each first phase electrode and then shifted out in accordance with the well known charge coupled shifting technique out to the three 1×M shift registers 75, 76, and 77. Thus one bit of information is shifted out of each shift register in each triplet set in the array into a respective one of the registers 75, 76, and 77. The information received by these registers 75, 76, and 77 is then shifted out to a series of detection amplifiers 28, 29, and 30 identical to those shown in FIGS. 2 and 3. Once the shift registers 75, 76, and 77 are cleared the next bit of information from the array shift registers triplet sets are shifted into them and the sequence repeated.

Once the information is introduced into the detection amplifiers it is processed in a manner identical to that described above, i.e. the photocurrent is sensed and converted into the appropriate voltages representative of the color of light incident on the array.

It should be understood that although insulator thickness was described in connection with the array the voltage and or surface doping concentrations can be used to establish the requisite different space charge or depletion depths.

Although a preferred embodiment has been described herein it should be obvious to those skilled in the art that the invention may be carried out in various ways and may take various forms of embodiments other than those described above. Accordingly, it is understood that the present invention is not limited by the details of the foregoing description but is defined by the following claims.

I claim:
1. A semiconductor light sensitive scanner comprising:
a body of semiconductor material having a substantially planar surface and containing a region of a first conductivity type and a region of a second conductivity type with a P-N junction defined in said body between said regions,
an insulating layer of said surface,
a plurality of conductive electrodes disposed on said layer,
means for biasing each of said regions and at least a first one of said electrodes at predetermined voltage values to establish between said one of said electrodes and said P-N junction a depletion region having therein a maximum electron potential energy location positioned a given distance from said surface,
the portion of said depletion region lying between said surface and said location comprising a charge storage region wherein charges are created by electromagnetic radiation of a given spectrum and stored therein, and
means coupled to said charge storage region for providing a signal indicative of the charge created in said charge storage region by said given spectrum of electromagnetic radiation.
2. The scanner of claim 1 wherein said plurality of electrodes include a charge coupled shift register.
3. The scanner of claim 1 wherein said plurality of electrodes include three charge coupled shift registers, each of said shift registers including at least one electrode biased to a predetermined voltage value to establish between said one electrode and said P-N junction a depletion region having a maximum electron potential energy location positioned a given distance from said surface,
the portion of said depletion region lying between said surface and said location comprising a charge storage region,
each charge storage region in each shift register being biased to have charges created therein by different spectrums of electromagnetic radiation and stored therein.
4. The scanner of claim 3 wherein said electromagnetic radiation has a wave length in the range between 3500 Angstroms and 8000 Angstroms.
5. The scanner of claim 1 wherein said region of said second conductivity type is parallel to and separated from said electrodes of said region of said first conductivity type.
6. The scanner of claim 1 wherein at least three of said electrodes are each biased at different predetermined voltage values to establish between each of said three electrodes and said P-N junction depletion regions each having a maximum electron potential energy location positioned at a different given distance from said surface, the portion of each of said depletion regions lying between said locations and said surface comprising different charge storage regions wherein charges are created by different given spectrums of electromagnetic radiation.

7. The scanner of claim 1 wherein said means coupled to said charge storage region for providing a signal comprises:

a detection amplifier, and a transfer gate, said detection amplifier comprises a second region of a second conductivity type in said body for sensing the charge stored in said charge storage region, a second one of said electrode connected to said second region and means for biasing said second region, said transfer gate comprises a third one of said electrodes disposed between said first one of said electrodes and said second one of said electrodes and means for biasing said third one of said electrode.

8. The scanner of claim 1 wherein said means coupled to said charge storage region for providing a signal comprises:

a transfer gate, and an analyzing system, said analyzing system comprising a detection amplifier coupled to three scaling amplifiers each of which is coupled to one of three adder circuits, said detection amplifier comprises a second region of said second conductivity type in said body, a field effect transistor having its gate coupled to said second region, its drain coupled to a voltage source and its source coupled to said scaling amplifiers, and means for biasing said region and said gate of said field effect transistor to a predetermined voltage level, each of said scaling amplifiers comprise a field effect transistor having its gate coupled to said detection amplifier and its drain coupled to a respective voltage source and is source coupled to a respective adder circuit.

9. A system for detecting and analyzing the color of light impinging on a semiconductor scanner comprising:

a body of semiconductor material having a substantially planar surface and containing a region of a first conductivity type and a region of a second conductivity type with a P-N junction defined in said body between said regions, an insulating layer on said surface, an array of three detectors each of which will store charge created therein by different spectrums of electromagnetic radiation, each detector comprising an electrode biased to a predetermined voltage value with respect to said first and second regions to establish between said electrode and said P-N junction a depletion region having a maximum electron potential energy location positioned a given distance from said surface the portion of said depletion region lying between said surface and said location comprising a charge storage region, a detection amplifier coupled to each of said detectors, a transfer gate coupled to each of said detection amplifiers, and an analyzing system comprising three scaling amplifiers coupled to each of said detection amplifiers and three adder circuits each of which is coupled to said amplifier systems.

* * * * *

UNITED STATES PATENT OFFICE
CERTIFICATE OF CORRECTION

Patent No. 3,985,449  Dated October 12, 1976

Inventor(s) Nicholas Alex Patrin

It is certified that error appears in the above-identified patent and that said Letters Patent are hereby corrected as shown below:

Column 4, line 56, the equation should read

-- $Q_2 = d_{21}\, ar + d_{22}\, ag + d_{23}\, ab$ --.

Column 4, line 57, the equation should read

-- $Q_3 = d_{31}\, ar + d_{32}\, ag + d_{33}\, ab$ --.

Column 6, line 52, the equation should read

-- $I_{031} - A_{31}V_1 + I_{032} - A_{32}V_2 + I_{033} - A_{33}V_3$ to adder 33. --.

Signed and Sealed this

Fourteenth Day of June 1977

[SEAL]

Attest:

RUTH C. MASON  
*Attesting Officer*

C. MARSHALL DANN  
*Commissioner of Patents and Trademarks*